(12) United States Patent
Tomohiro

(10) Patent No.: US 6,794,763 B2
(45) Date of Patent: Sep. 21, 2004

(54) SEMICONDUCTOR DEVICE AND METHOD OF MANUFACTURING THE SAME

(75) Inventor: Yasuhiko Tomohiro, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/290,091

(22) Filed: Nov. 6, 2002

(65) Prior Publication Data

US 2003/0094705 A1 May 22, 2003

(30) Foreign Application Priority Data

Nov. 20, 2001 (JP) ........................................ 2001-355070

(51) Int. Cl.$^7$ ............................................ H01L 23/544
(52) U.S. Cl. ...................................................... 257/797
(58) Field of Search ............................... 257/797, 296, 257/300; 438/401, 462, 14

(56) References Cited

U.S. PATENT DOCUMENTS 5,892,291 A * 4/1999 Narimatsu et al.
6,114,072 A * 9/2000 Narimatsu
6,314,543 B1 * 11/2001 Ymaguchi

FOREIGN PATENT DOCUMENTS

| JP | 63-291431 | 11/1988 |
|----|-----------|---------|
| JP | 03-107845 | 5/1991 |
| JP | 05-119467 | 5/1993 |
| JP | 07-153667 | 6/1995 |
| JP | 07-297252 | 11/1995 |
| JP | 09-213901 | 8/1997 |
| JP | 10-056048 | 2/1998 |

* cited by examiner

Primary Examiner—S. V. Clark
(74) Attorney, Agent, or Firm—Hogan & Hartson, LLP

(57) ABSTRACT

A semiconductor device includes an effective pattern region and at least one measurement mark region. The measurement mark region includes a measuring objective portion. The measuring objective portion has the same shape as a portion forming part of the effective pattern region.

16 Claims, 4 Drawing Sheets

EFFECTIVE PATTERN REGION    MEASUREMENT MARK REGION

EFFECTIVE PATTERN REGION    MEASUREMENT MARK REGION

EFFECTIVE PATTERN REGION    MEASUREMENT MARK REGION

SEMICONDUCTOR DEVICE AND METHOD OF MANUFACTURING THE SAME

Japanese Patent Application No. 2001-355070 filed on Nov. 20, 2001, is hereby incorporated by reference in its entirety.

BACKGROUND OF THE INVENTION

The present invention relates to a semiconductor device having a measurement mark region and a method of manufacturing the same.

When manufacturing a semiconductor device, there is a case where a predetermined portion is measured during the manufacturing process. The measurement is generally performed by using electron beams. However, an irradiated area may react with the electron beams and cause problems in the subsequent processing.

BRIEF SUMMARY OF THE INVENTION

The present invention may provide a semiconductor device which enables the dimensions of a predetermined portion to be obtained without causing characteristics of the semiconductor device to be adversely affected, and a method of manufacturing the same.

A semiconductor device as one aspect of the present invention comprises:

an effective pattern region and at least one measurement mark region, wherein the measurement mark region includes a measuring objective portion, and wherein the measuring objective portion has the same shape as a portion forming part of the effective pattern region.

A first method of manufacturing a semiconductor device as another aspect of the present invention is a method of manufacturing a semiconductor device including an effective pattern region and at least one measurement mark region, wherein the measurement mark region includes a measuring objective portion, wherein the measuring objective portion has the same shape as a portion forming part of the effective pattern region, wherein the method comprising:

forming a portion that constitutes part of the effective pattern region in the effective pattern region and forming the measuring objective portion having the same shape as the portion that constitutes part of the effective pattern region in the measurement mark region; and measuring the measuring objective portion.

A second method of manufacturing a semiconductor device as a further aspect of the present invention is a method of manufacturing a semiconductor device including an effective pattern region and at least one measurement mark region, wherein the measurement mark region includes a first portion which forms part of the effective pattern region, and a second portion which corresponds to the first portion, wherein the method comprising:

forming a third portion necessary for forming the first portion in the effective pattern region and forming a fourth portion necessary for forming the second portion in the measurement mark region so that the third portion and the fourth portion have the same shape; and measuring the fourth portion.

DETAILED DESCRIPTION OF THE EMBODIMENT

Figure 1:
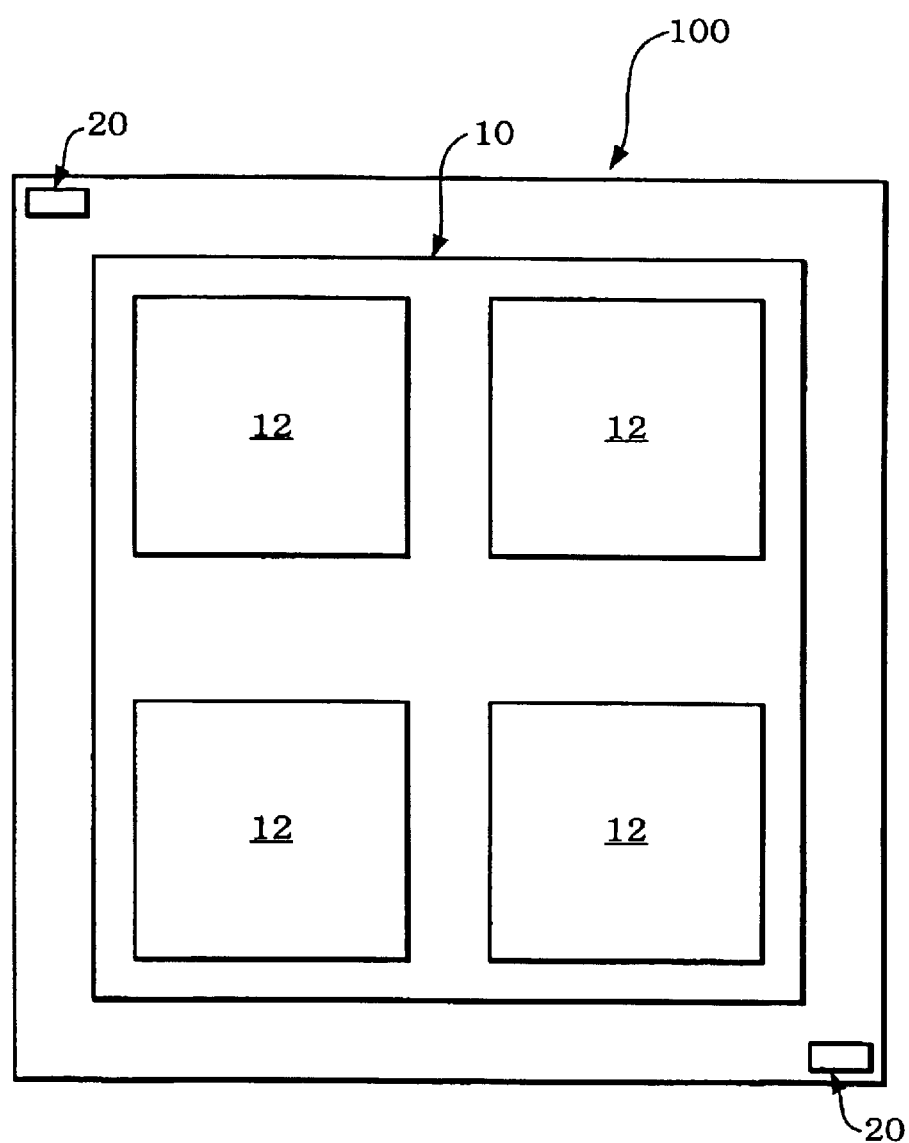
FIG. 1 is a plan view schematically showing a semiconductor device.

A semiconductor device according to one embodiment of the present invention comprises:

an effective pattern region and at least one measurement mark region, wherein the measurement mark region includes a measuring objective portion, and wherein the measuring objective portion has the same shape as a portion forming part of the effective pattern region.

According to the semiconductor device of this embodiment, the measuring objective portion provided in the measurement mark region has the same shape as part of the effective pattern region. Therefore, the dimensions of part of the effective pattern region can be measured by measuring the dimensions of the measuring objective portion provided in the measurement mark region. As a result, since the effective pattern region is not irradiated with electron beams when measuring the dimensions, the effective pattern region can be prevented from being adversely affected by electron beams.

The semiconductor device of this embodiment may have a semiconductor memory region, the effective pattern region may include a memory cell array region, the measurement mark region may include a dummy memory cell array region having the measuring objective portion, and dummy memory cells in the dummy memory cell array region may have the same pattern as memory cells in the memory cell array region.

The surrounding environment of the measuring objective portion can be almost the same as the surrounding environment of a portion in the memory cell array region corresponding to the measuring objective portion by providing not only the measuring objective portion but also the dummy memory cell array region including the measuring objective portion in the measurement mark region. Therefore, the dimensions of the portion in the memory cell array region corresponding to the measuring objective portion can be measured more precisely.

The memory cell array may be an SRAM array.

The semiconductor device of this embodiment may have a rectangular planar shape, and two of the measurement mark regions may be provided at two corners on the same diagonal of the semiconductor device, respectively.

The degree of alignment deviation in the X and Y directions is easily confirmed by providing the two measurement mark regions at the respective two corners on the same diagonal of the semiconductor device. Moreover, the presence or absence of distortion of the pattern may be easily confirmed.

The measuring objective portion may be a through hole formed by using a plurality of mask layers.

The through hole may be formed by using a first mask layer and a second mask layer provided on a side-surface of the first mask layer inside an opening of the first mask layer.

In more detail, the through hole may be formed by a step of forming a first mask layer having an opening and a step of forming a second mask layer on a side-surface of the first mask layer on a side of the opening.

The first mask layer may be a resist layer, and the second mask layer may be a resist pattern adjustment layer.

(A) A first method of manufacturing a semiconductor device according to another embodiment of the present invention is a method of manufacturing a semiconductor device including an effective pattern region and at least one measurement mark region, wherein the measurement mark region includes a measuring objective portion, wherein the measuring objective portion has the same shape as a portion forming part of the effective pattern region, wherein the method comprising:

forming a portion that constitutes part of the effective pattern region in the effective pattern region and forming the measuring objective portion having the same shape as the portion that constitutes part of the effective pattern region in the measurement mark region; and measuring the measuring objective portion.

In the present invention, the measuring objective portion is formed in the measurement mark region. The measuring objective portion has the same shape as the portion which forms part of the effective pattern region. Therefore, the dimensions of part of the effective pattern region corresponding to the measuring objective portion can be obtained by measuring the measuring objective portion in the above step. As a result, since the effective pattern region is not irradiated with electron beams when measuring the dimensions, the effective pattern region can be prevented from being adversely affected by electron beams.

(B) A second method of manufacturing a semiconductor device according to a further embodiment of the present invention is a method of manufacturing a semiconductor device including an effective pattern region and at least one measurement mark region, wherein the measurement mark region includes a first portion which forms part of the effective pattern region, and a second portion which corresponds to the first portion, wherein the method comprising:

forming a third portion necessary for forming the first portion in the effective pattern region and forming a fourth portion necessary for forming the second portion in the measurement mark region so that the third portion and the fourth portion have the same shape; and measuring the fourth portion.

In this embodiment, the third portion provided in the effective pattern region has the same shape as the fourth portion provided in the measurement mark region. The fourth portion is measured, and the dimensions of the third portion can be obtained by measuring the fourth portion. As a result, since the effective pattern region is not irradiated with electron beams when measuring the dimensions, the effective pattern region can be prevented from being adversely affected by electron beams.

The step of forming the third portion and the fourth portion may be a step of forming a first mask layer having a predetermined pattern, the first mask layer may have a first opening in the effective pattern region as the third portion and a second opening in the measurement mark region as the fourth portion, and the step of measuring the fourth portion may be a step of measuring a diameter of the second opening.

The method may comprise a step of forming second mask layers on side-surfaces of the first mask layer inside the first opening and the second opening, respectively, after the step of measuring the fourth portion.

The method may comprise a step of measuring a diameter of the second opening after the step of forming the second mask layer.

The method may comprise a step of forming a through hole by using the first mask layer and the second mask layer as a mask.

The first mask layer may be a resist layer, and the second mask layer may be a resist pattern adjustment layer.

The first and second methods of manufacturing a semiconductor device as embodiments of the present invention may have at least one of the following features.

(a) The semiconductor device may have a semiconductor memory region, the effective pattern region may include a memory cell array region, the measurement mark region may include a dummy memory cell array region, and dummy memory cells in the dummy memory cell array region may have the same pattern as memory cells in the memory cell array region.

In this case, the memory cell array may be an SRAM array.

(b) The semiconductor device may have a rectangular planar shape, and two of the measurement mark regions may be provided at two corners on the same diagonal of the semiconductor device, respectively.

Embodiments of the present invention are described below in more detail with reference to the drawings.

1. Configuration of Semiconductor Device

Figure 2:
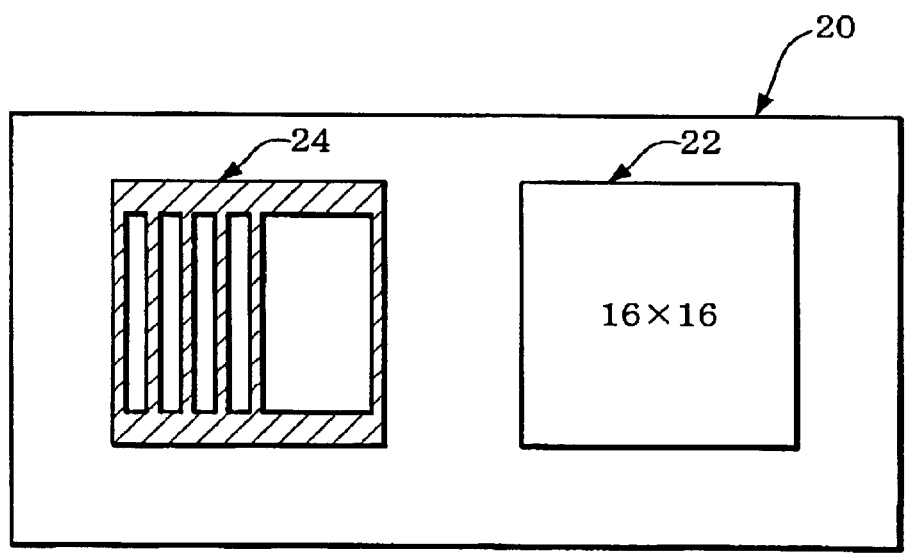
FIG. 2 is an enlarged view showing a measurement mark region.

The configuration of a semiconductor device is described below taking the case where the semiconductor device has a semiconductor memory region as an example. FIG. 1 is a plan view schematically showing a semiconductor device. FIG. 2 is an enlarged plan view showing a measurement mark region 20 shown in FIG. 1.

A semiconductor device 100 includes an effective pattern region 10 and measurement mark regions 20.

The effective pattern region 10 is a region in which functional sections for exhibiting functions of the semiconductor device are formed. In the example of the present embodiment, the effective pattern region 10 includes memory cell array regions 12. There are no specific limitations to memory cells in the memory cell array region 12. The memory cells in the memory cell array region 12 may be memory cells of an SRAM, for example.

As shown in FIG. 2, a dummy memory cell array region 22 is provided in the measurement mark region 20. The pattern and shape of memory cells in the dummy memory cell array region 22 are the same as the pattern and shape of the memory cells in the memory cell array region in the effective pattern region 10. Therefore, the dimensions of a portion in the memory cell array region can be measured by measuring the dimensions of a portion (measuring objective portion) in the dummy memory cell array region 22 corresponding to the portion in the memory cell array region. In the dummy memory cell array region 22, 16 memory cells may be disposed in each of the row direction and the column direction.

The number of measurement mark regions 20 may be one or more. There are no specific limitations to the position of the measurement mark region 20. In the case where a plurality of measurement mark regions 20 is provided, two measurement mark regions 20 are preferably provided at the corners on the same diagonal of the semiconductor device 100.

As the portion in the dummy memory cell array region 22 to be measured, a through hole, a channel width, a channel length, an interconnect width, and the like can be given.

The measurement mark region 20 may optionally include an interconnecting pattern 24 for checking whether or not a coarse interconnecting pattern and a dense interconnecting pattern are formed in a desired shape.

Effects of the semiconductor device according to the present embodiment are described below.

(a) The dimensions of a predetermined portion (a constituent portion of a memory cell, an opening in a resist, for example) in the memory cell array region in the effective pattern region 10 are generally measured in the manufacturing process of the semiconductor device. The dimensions are generally measured-by using electron beams. Therefore, the predetermined portion in the memory cell array region may be adversely affected by electron beams.

However, in the present embodiment, the dummy memory cell array region 22 is provided in the measurement mark region 20. The memory cells in the dummy memory cell array region 22 have the same pattern and shape as the memory cells in the memory cell array region 12. Therefore, the dimensions of the portion in the memory cell array region 12 can be obtained by measuring the dimensions of the portion in the dummy memory cell array region 22. As a result, the portion in the memory cell array region 12 can be prevented from being adversely affected.

(b) The degree of alignment deviation in the X and Y directions are easily confirmed by providing the measurement mark regions 20, in particular, the dummy memory cell array regions 22 at two corners located on the same diagonal. Moreover, the presence or absence of distortion of the pattern is easily confirmed.

(c) The surrounding environment of the measuring objective portion can be almost the same as the surrounding environment of the portion in the memory cell array region 12 corresponding to the measuring objective portion by providing the dummy memory cell array region 22 in the measurement mark region 20 in a single semiconductor device, specifically, on one chip. Therefore, the dimensions of the portion in the memory cell array region 12 corresponding to the measuring objective portion can be obtained more precisely.

(d) In the case where the portion to be measured is a through hole, the present embodiment is particularly useful when the diameter of the through hole is 0.5 $\mu$m or less. In more detail, the present embodiment is particularly useful in the case of measuring the dimensions of a through hole formed by using a resist pattern adjustment technology.

MODIFICATION EXAMPLE

The effective pattern region 10 may include a region other than the memory cell array region. There are no specific limitations to such a region insofar as the region is a functional region for exhibiting functions of the semiconductor device.

In the above example, the dummy memory cell array region 22 is provided in the measurement mark region 20 as a region having the same configuration as part of the effective pattern region 10. However, such a region is not limited to the dummy memory cell array region 22. A measuring objective portion having the same shape as a portion in the effective pattern region 12, the dimensions of which to be obtained, may be provided in the measurement mark region 20.

2. Method of Manufacturing Semiconductor Device

A method of manufacturing a semiconductor device according to an embodiment of the present invention is described below. In the present embodiment, the method is described taking a method of forming a through hole as an example. FIG. 3 is a cross-sectional view schematically showing formation steps of a through hole. In FIG. 3, part of the effective pattern region in which a through hole is formed and part of the measurement mark region in which a through hole is formed are illustrated.

Figure 3A:
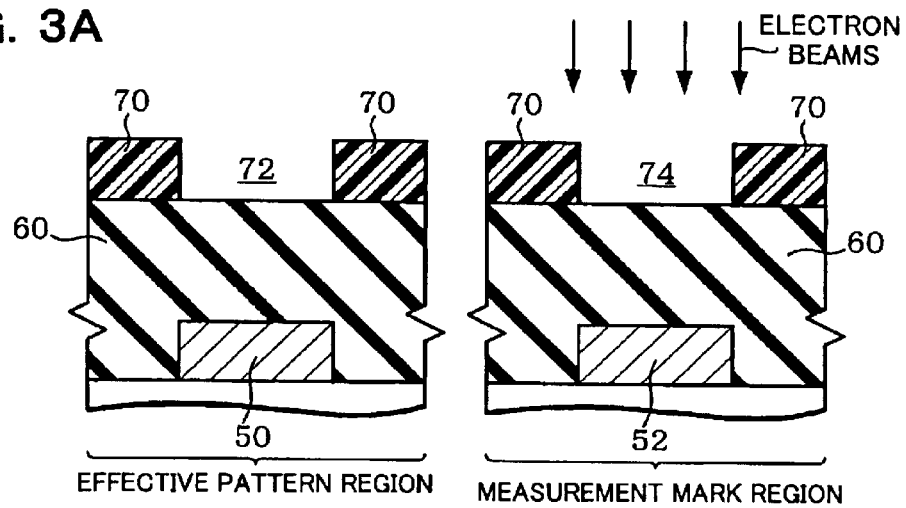
FIG. 3 is a cross-sectional view schematically showing manufacturing steps of the semiconductor device according to an embodiment of the present invention.

As shown in FIG. 3A, a resist layer 70 having a predetermined pattern is formed on an interlayer dielectric 60 formed on interconnect layers 50 and 52. The resist layer 70 has a first opening 72 provided in the effective pattern region and a second opening 74 provided in the measurement mark region. The first opening 72 and the second opening 74 have the same shape. The diameters of the first opening 72 and the second opening 74 are set larger than the diameters of the through holes to be formed.

The diameter of the second opening 74 is then measured. The diameter of the second opening 74 may be measured by a method which using electron beams, for example. Since the first opening 72 and the second opening 74 have the same shape, the diameter of the first opening 72 can be measured by measuring the diameter of the second opening 74. Therefore, it is unnecessary to directly measure the diameter of the first opening 72.

Figure 3B:
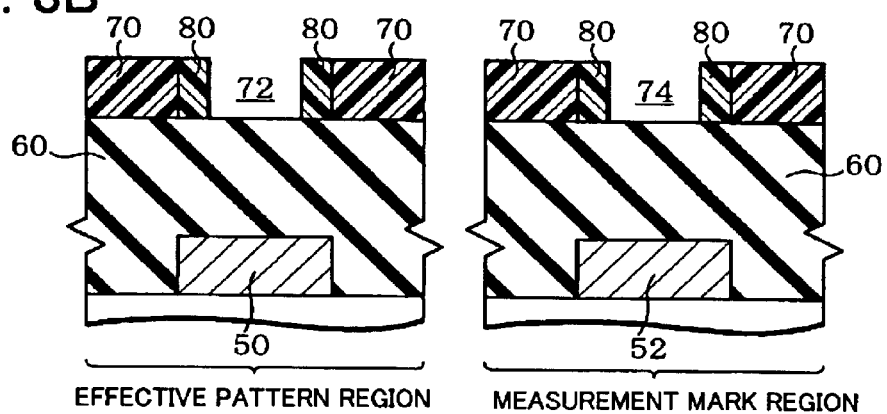

As shown in FIG. 3B, resist pattern adjustment layers 80 are formed on the side-surfaces of the resist layer 70 inside the first opening 72 and the second opening 74, respectively. The diameters of the first opening 72 and the second opening 74 are decreased by forming the resist pattern adjustment layers 80 and correspond to the diameters of the through holes to be formed.

The diameters of the first opening 72 and the second opening 74 are measured, as required.

Figure 3C:
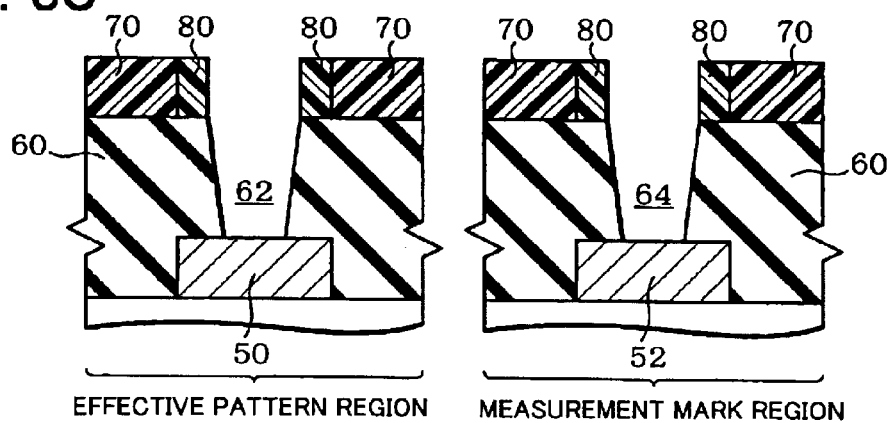
Figure 4:
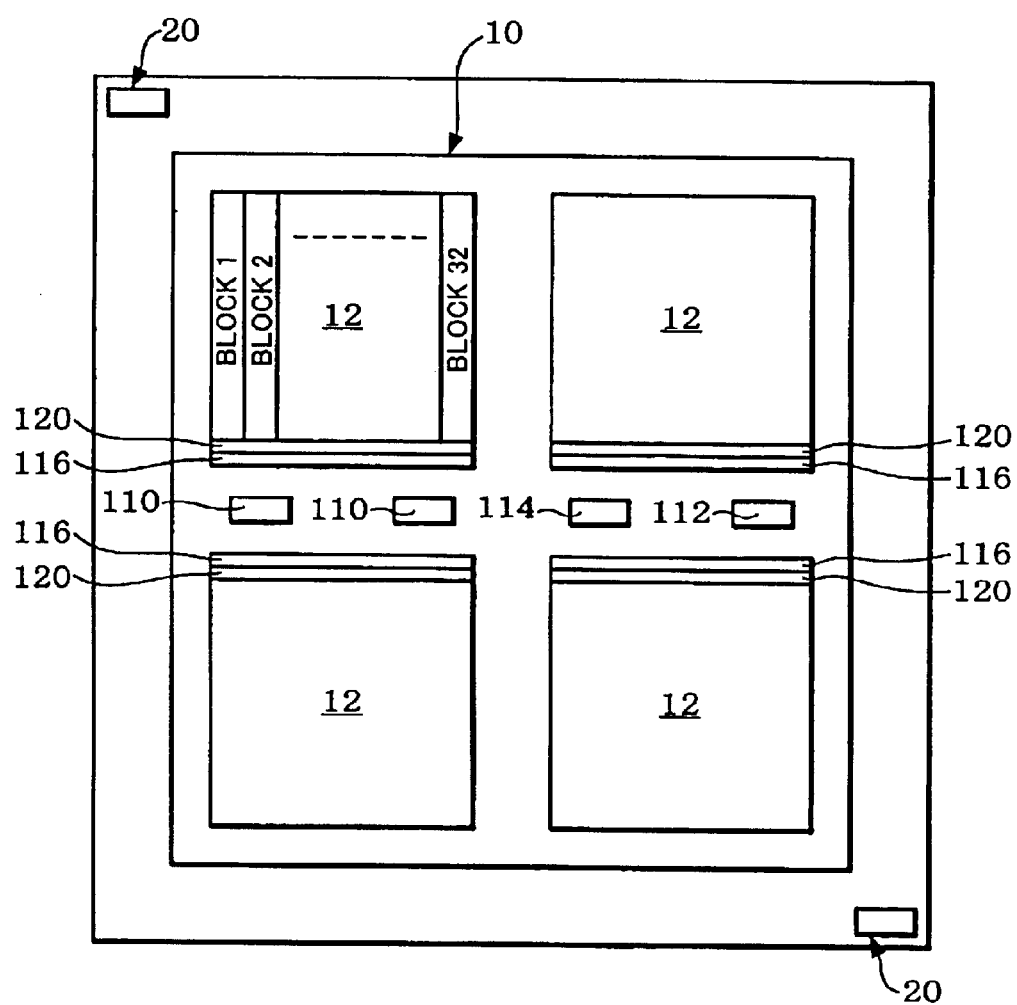
FIG. 4 is a plan view showing an example of an effective pattern region.

The interlayer dielectric 60 is etched by using the resist layer 70 and the resist pattern adjustment layer 80 as a mask, thereby forming through holes 62 and 64, as shown in FIG. 3C.

Effects of the method of manufacturing the semiconductor device according to the present embodiment are described below.

The method of the present embodiment has the following advantages.

The diameter of the opening in the resist layer 70 is generally measured by irradiation of electron beams. Since the resist layer 70 is changed upon irradiation of electron beams, it is difficult to form the resist pattern adjustment layer 80 on the side-surface of the resist layer 70. If the resist pattern adjustment layer 80 is not formed, a through hole having a diameter larger than the desired diameter is formed, whereby problems such as short circuits occur.

However, in the present embodiment, the diameter of the first opening 72 is indirectly measured by measuring the diameter of the second opening 74. Therefore, the resist layer 70 in the first opening 72 is not irradiated with electron beams. Specifically, the resist layer 70 is not irradiated with electron beams in the effective pattern region. As a result, the resist pattern adjustment layer 80 can be reliably formed on the side-surface of the resist layer 70 inside the opening in the effective pattern region. Because of this, the through hole 62 having a desired diameter can be reliably formed in the effective pattern region.

It is difficult to form a minute through hole by only using a resist layer. However, a minute through hole can be easily formed by forming the through hole by using the resist pattern adjustment layer.

3. Configuration Example of Effective Pattern Region

An example in the case where the effective pattern region has a semiconductor memory region is described below.

The effective pattern region 10 includes the memory cell array regions 12, X predecoders 110, an X decoder (not shown) a Y predecoder 112, a Y decoder (not shown), a Z predecoder 114, and a Z decoder (not shown).

Each of the memory cell array regions 12 is divided into 32 blocks. The memory cell array region 12 is formed of an SRAM, for example.

The X predecoders 110 and the X decoder select a predetermined wordline based on an input address signal. The Y predecoder 112 and the Y decoder select a predetermined bitline (bitline pair) based on the input address signal. The Z predecoder and the Z decoder select a predetermined block in the memory cell array region based on the input address signal.

Fuse circuits 120 for switching from a defective memory cell block to a redundant memory cell block may be provided, if necessary.

The present invention is not limited to the above embodiment. Various modifications and variations are possible within the scope of the present invention.

What is claimed is:

1. A semiconductor device comprising:

an effective pattern region including a memory cell array region;

and measurement mark region provided in a region different from the effective pattern region, the measurement mark region including a dummy memory cell array region, wherein dummy memory cells in the dummy memory cell array region have a same pattern as memory cells in the memory cell array region, and wherein dimension of at least a portion of the dummy memory cell array region is indirectly obtained by measuring dimension of at least a portion of the memory cell array region.

2. The semiconductor device as defined by claim 1, wherein the memory cell array is an SRAM array.

3. The semiconductor device as defined by claim 1, wherein the semiconductor device has a rectangular planar shape, and wherein at least two measurement mark regions are provided, and two of which are provided at two corners on the same diagonal of the semiconductor device, respectively.

4. The semiconductor device as defined by claim 1, wherein the at least one portion of the dummy memory cell array region is a through hole formed by using a plurality of mask layers.

5. The semiconductor device as defined by claim 4, wherein the through hole is formed by using a first mask layer and a second mask layer provided on a side-surface of the first mask layer inside an opening of the first mask layer.

6. The semiconductor device as defined by claim 4, wherein the through hole is formed by a step of forming a first mask layer having an opening and a step of forming a second mask layer on a side-surface of the first mask layer on a side of the opening.

7. The semiconductor device as defined by claim 5, wherein the first mask layer is a resist layer, and wherein the second mask layer is a resist pattern adjustment layer.

8. A method of manufacturing a semiconductor device comprising an effective pattern region including a memory cell array region, and a measurement mark region provided in a region different from the effective pattern region, the measurement mark region including a dummy memory cell array region, comprising:

forming dummy memory cells in the dummy memory cell array region by a same step as forming memory cells in the memory cell array region, the dummy memory cells and memory cells being formed to have a same pattern, wherein dimension of at least a portion of the dummy memory cell array region is indirectly obtained by measuring dimension of at least a portion of the memory cell array region.

9. The method of manufacturing a semiconductor device as defined by claim 8, wherein the at least one portion of the dummy memory cell array region is a through hole formed by using a plurality of mask layers.

10. The method of manufacturing a semiconductor device as defined by claim 9, further comprising:

a step of forming a first mask layer on interlayer dielectric in order to form the through hole, wherein the first mask layer has a first opening in the memory cell array region and a second opening in the dummy memory cell array region, and wherein the first and second openings are formed to have same diameters, and the diameter of the first opening is indirectly obtained by measuring the diameter of the second opening.

11. The method of manufacturing a semiconductor device as defined by claim 10, further comprising:

a step of forming the second mask layers on side-surfaces of the first mask layer inside the first opening and the second opening, respectively, after measuring the diameter of the second opening.

12. The method of manufacturing a semiconductor device as defined by claim 11, further comprising:

step of indirectly measuring the diameter of the second opening diminished by the second mask layer in the memory cell array region, through measuring the diameter of the second opening diminished by the second mask layer in the dummy memory cell array region after forming the second mask layer.

13. The method of manufacturing a semiconductor device as defined by claim 11, further comprising:

a step of forming a through hole by using the first mask layer and the second mask layer as a mask.

14. The method of manufacturing a semiconductor device as defined by claim 11, wherein the first mask layer is a resist layer, and wherein the second mask layer is a resist pattern adjustment layer.

15. The method of manufacturing a semiconductor device as defined by claim 8, wherein the memory cell array is an SRAM array.

16. The method of manufacturing a semiconductor device as defined by claim 8, wherein the semiconductor device has a rectangular planar shape, and wherein at least two measurement mark regions are provided, and two of which are provided at two corners on the same diagonal of the semiconductor device, respectively.

* * * * *